(12) United States Patent
Jung et al.

(10) Patent No.: US 10,741,746 B2
(45) Date of Patent: Aug. 11, 2020

(54) PRESSURE SENSOR AND MANUFACTURING METHOD THEREOF

(71) Applicant: KOREA ELECTRONICS TECHNOLOGY INSTITUTE, Seongnam-si, Gyeonggi-do (KR)

(72) Inventors: Suk Won Jung, Osan-si (KR); Nam Kyu Cho, Yongin-si (KR)

(73) Assignee: KOREA ELECTRONICS TECHNOLOGY INSTITUTE, Seongnam-si, Gyeonggi-Do (KR)

(*) Notice: Subject to any disclaimer, the term of this patent is extended or adjusted under 35 U.S.C. 154(b) by 0 days.

(21) Appl. No.: 16/163,934

(22) Filed: Oct. 18, 2018

(65) Prior Publication Data
US 2019/0172995 A1    Jun. 6, 2019

(30) Foreign Application Priority Data
Dec. 5, 2017  (KR) .......... 10-2017-0165992

(51) Int. Cl.
| H01L 41/08 | (2006.01) |
| H01L 41/39 | (2013.01) |
| H01L 29/84 | (2006.01) |
| H01L 41/113 | (2006.01) |
| H01L 29/06 | (2006.01) |
| H01L 41/18 | (2006.01) |
| G01L 9/00 | (2006.01) |

(52) U.S. Cl.
CPC ........ *H01L 41/0805* (2013.01); *G01L 9/0042* (2013.01); *G01L 9/0055* (2013.01); *H01L 29/0669* (2013.01); *H01L 29/84* (2013.01); *H01L 41/1132* (2013.01); *H01L 41/18* (2013.01); *H01L 41/39* (2013.01)

(58) Field of Classification Search
CPC . H01L 41/0805; H01L 41/18; H01L 29/0669; H01L 41/1132; H01L 29/84; H01L 41/39; G01L 9/0042; G01L 9/0055; G01L 7/08; G01H 9/00
See application file for complete search history.

(56) References Cited

U.S. PATENT DOCUMENTS 9,722,165 B2 * 8/2017 Carr .................. H01L 35/26

FOREIGN PATENT DOCUMENTS

KR    10-2011-0072513 A    6/2011

OTHER PUBLICATIONS

Jung, Suk Won and five others, The Study on the Fabrication of Microphones using Si Nanowire's Piezoresistive Effects, Symposium collected papers of the Korean Institute of Electrical Engineers in 2010, Jul. 2010, pp. 1585-1586 (Year: 2010).*

(Continued)

*Primary Examiner* — Victor A Mandala
(74) *Attorney, Agent, or Firm* — Hauptman Ham, LLP

(57) ABSTRACT

Disclosed is a silicon nanowire pressure sensor including a lower substrate with a diaphragm recess in a lower surface thereof, an upper substrate having a first surface attached to an upper surface of the lower substrate, silicon nanowires formed on the first surface of the upper substrate, resistive portions exposed on a second surface of the upper substrate, and a diaphragm region formed by etching a center portion of the second surface of the upper substrate so as to be aligned with the resistive portions, in which the diaphragm recess is larger than the diaphragm region.

4 Claims, 12 Drawing Sheets

(56) References Cited

OTHER PUBLICATIONS

Suk Won Jung et al., "The Study on the Fabrication of Microphones using Si Nanowire's Piezoresistive Effects," Symposium collected papers of the Korean Institute of Electrical Engineers, Jul. 2010, pp. 1585-1586, The Korean Institute of Electrical Engineers, with English Abstract.
Korean Office Action dated Jun. 15, 2018, issued in corresponding Korean Patent Application No. 10-2017-0165992, citing the above document.

* cited by examiner

PRESSURE SENSOR AND MANUFACTURING METHOD THEREOF

CROSS REFERENCE TO RELATED APPLICATION(S)

This application claims the benefit of Korean Patent Application No. 10-2017-0165992, filed Dec. 5, 2017, entitled Pressure Sensor and Manufacturing Method Thereof, which is hereby incorporated by reference in its entirety into this application.

BACKGROUND OF THE INVENTION

1. Technical Field

The present invention relates to a pressure sensor and a method of manufacturing the same. More particularly, the present invention relates to a pressure sensor using a silicon nanowire as a piezoelectric element, the pressure sensor being configured such that mechanical deformation of a sensing film due to pressure applied thereto is transferred to a specific portion of a silicon nanowire piezoelectric element, and a method of manufacturing the same.

2. Description of the Background Art

In a conventional pressure sensor, a piezoresistive element is formed as a doped region formed through a doping process in a silicon substrate. Such a conventional pressure sensor detects pressure through a change in electrical resistance of the piezoresistive element, which occurs due to mechanical deformation of a sensing film when pressure is applied to a diaphragm. In this case, since the piezoresistive element is fabricated as a doped region in a silicon substrate, the sensitivity of the piezoresistive element is not high. To overcome this problem and maximize the performance of a pressure sensor, a piezoresistive element is usually disposed at the boundary of a diaphragm where mechanical deformation is greatest. In this case, it is necessary to precisely position a piezoresistive element at the boundary of a diaphragm. However, since the diaphragm is famed by bulk-etching the backside of a substrate, it is difficult to manufacture the diaphragm such that the boundary of the diaphragm is precisely aligned with the piezoresistive element.

DOCUMENT OF RELATED ART

Patent Document (Patent 10 1) Korean Patent No. 10-2011-0072513

SUMMARY OF THE INVENTION

Accordingly, the present invention has been made keeping in mind the above problems occurring in the related art, and an object of the present invention is to provide a pressure sensor using a silicon nanowire having a high piezoresistivity as a sensing element. Additionally, the present invention is intended to provide a pressure sensor having a structure in which stress due to deformation at a boundary of a diaphragm can be easily and reliably transferred to a silicon nanowire, and to provide a method of manufacturing the same.

In order to accomplish the above object, the present invention provides a silicon nanowire pressure sensor including: a lower substrate with a diaphragm recess in a lower surface thereof; an upper substrate having a first surface attached to an upper surface of the lower substrate; a silicon nanowire formed on the first surface of the upper substrate; resistive portions exposed on a second surface of the upper substrate; and a diaphragm region formed by etching a center portion of the second surface of the upper substrate so as to be aligned with the resistive portions, in which the diaphragm recess is larger than the diaphragm region.

The pressure sensor further may further include a plurality of silicon blocks formed on the second surface of the upper substrate in a manner of being electrically insulated from each other, the silicon blocks being formed by locally etching the second surface of the upper substrate and being electrically connected only via the resistive portions, in which side walls of a part of the silicon blocks constitute a boundary of the diaphragm region.

The resistive portions include first resistive portions formed inside the diaphragm region and second resistive portions formed outside the diaphragm region.

The number of silicon blocks may be four and the four silicon blocks may be positioned in four quadrants of the upper substrate respectively. The number of the first resistive portions may be two and the two first resistive portions may be positioned at a middle portion of the upper substrate and disposed at boundaries of the quadrants so as to be spaced from each other. The two first resistive portions electrically connect two adjacent silicon blocks to each other among the four silicon blocks. The number of second resistive portions may be two and the two second resistive portions may be positioned at the middle portion of the upper substrate and at boundaries of the quadrants so as to be spaced from each other in a direction perpendicular to the direction in which the first resistive portions are spaced. The two second resistive portions electrically connect two adjacent silicon blocks to each other among the four silicon blocks.

The pressure sensor may further include electrodes respectively provided on the silicon blocks.

In order to accomplish the above object, the present invention provides a method of manufacturing a silicon nanowire pressure sensor, the method including: a first step of preparing an upper substrate with a resistive portion including a silicon nanowire; a second step of preparing a lower substrate; a third step of attaching a first surface of the upper substrate to an upper surface of the lower substrate; a fourth step of foaming a diaphragm region by etching a center portion of a second surface of the upper substrate using the resistive portion as an alignment reference position for the etching; and a fifth step of forming a diaphragm recess having a larger size than the diaphragm region by etching a lower surface of the lower substrate.

The fourth step may include: partially removing the upper substrate from the second surface by a first thickness to leave the upper substrate having a predetermined thickness; forming an electrode on the second surface of the upper substrate; and performing an insulation step of etching a center portion of the second surface of the upper substrate using the resistive portion as an alignment reference position for the etching so that a part of side walls of a plurality of silicon blocks that are formed when the resistive portion is exposed on the second substrate of the upper substrate are disposed at boundaries of the diaphragm region and the silicon blocks are electrically connected only via the resistive portion.

The second step may be a step of preparing the lower substrate having a second surface in which a doped region is formed. The fifth step may be a step of forming the diaphragm recess by etching a first surface of the lower substrate until reaching a position near the doped region by stopping the etching when an etching rate is significantly reduced, so that the lower substrate has a uniform thickness in a region in which the diaphragm recess is formed.

In the first step, the resistive portion may include a first resistive portion and a second resistive portion. In the insulation step, the second surface of the upper substrate may be etched such that the first resistive portion is formed inside the diaphragm region and the second resistive portion is famed outside the diaphragm region.

The pressure sensor according to the present invention uses a silicon nanowire as a sensing element. Therefore, the pressure sensor has a highly sensitive piezoresistivity.

In addition, the diaphragm region is formed by etching the upper substrate while using the silicon nanowire as an alignment reference position for the etching. Therefore, the silicon nanowire can be formed at the boundary of the diaphragm region. That is, since the silicon nanowire can be formed at a region where mechanical deformation is greatest, the performance of the pressure sensor can be maximized.

In addition, since the diaphragm region is defined in the upper substrate, the only requirement for the diaphragm recess is that the size of the diaphragm recess is larger than the size of the diaphragm region. Therefore, the diaphragm recess is formed, a high alignment precision with respect to the silicon nanowire is not required. This results in a decrease in defect rate when manufacturing pressure sensors.

BRIEF DESCRIPTION OF THE DRAWINGS

The above and other objects, features and other advantages of the present disclosure will be more clearly understood from the following detailed description taken in conjunction with the accompanying drawings, in which:

FIGS. 8B, 8C and 8D are cross-sectional views taken along the line A-A' of FIG. 1 to illustrate steps of forming the insulating layer on the upper substrate in the method of manufacturing the silicon nanowire pressure sensor according to the embodiment of the present invention.

DESCRIPTION OF THE PREFERRED EMBODIMENTS

Figure 1:
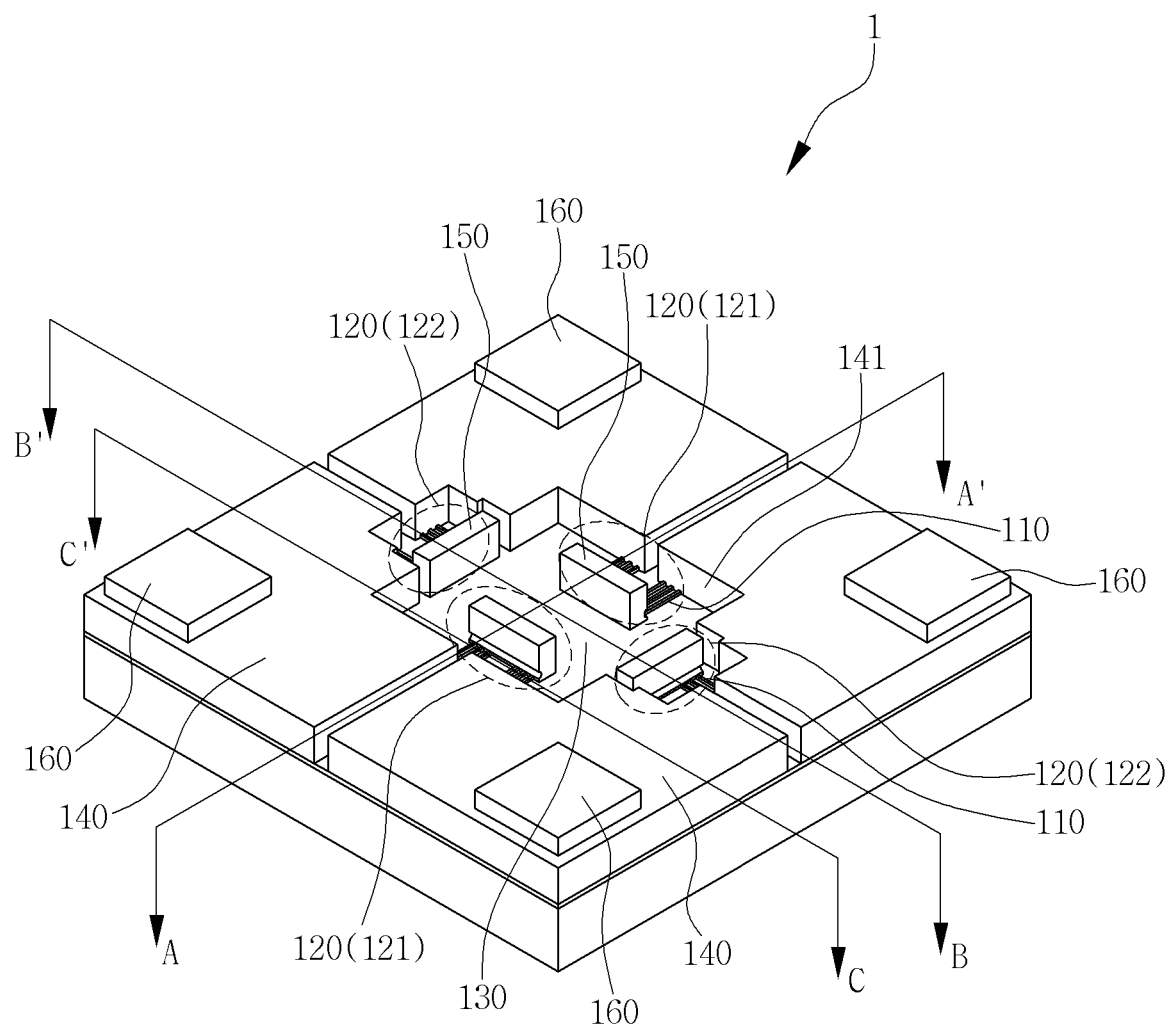
FIG. 1 is a perspective view of a silicon nanowire pressure sensor according to one embodiment of the present invention.

Reference now should be made to the drawings, in which the same reference numerals are used throughout the different drawings to designate the same or similar components.

The above and other objects, features and advantages of the present invention will be more clearly understood from the following detailed description taken in conjunction with the accompanying drawings. Reference now should be made to the drawings, in which the same reference numerals are used throughout the different drawings to designate the same or similar components. Further, it will be understood that, although the terms "one side", "the other side", "first," "second," etc. may be used herein to describe various elements, these elements should not be limited by these terms. Further, when it is determined that the detailed description of the known art related to the present invention might obscure the gist of the present invention, the detailed description thereof will be omitted.

Herein below, exemplary embodiments of the present invention will be described in detail with reference to the accompanying drawings.

Figure 2:
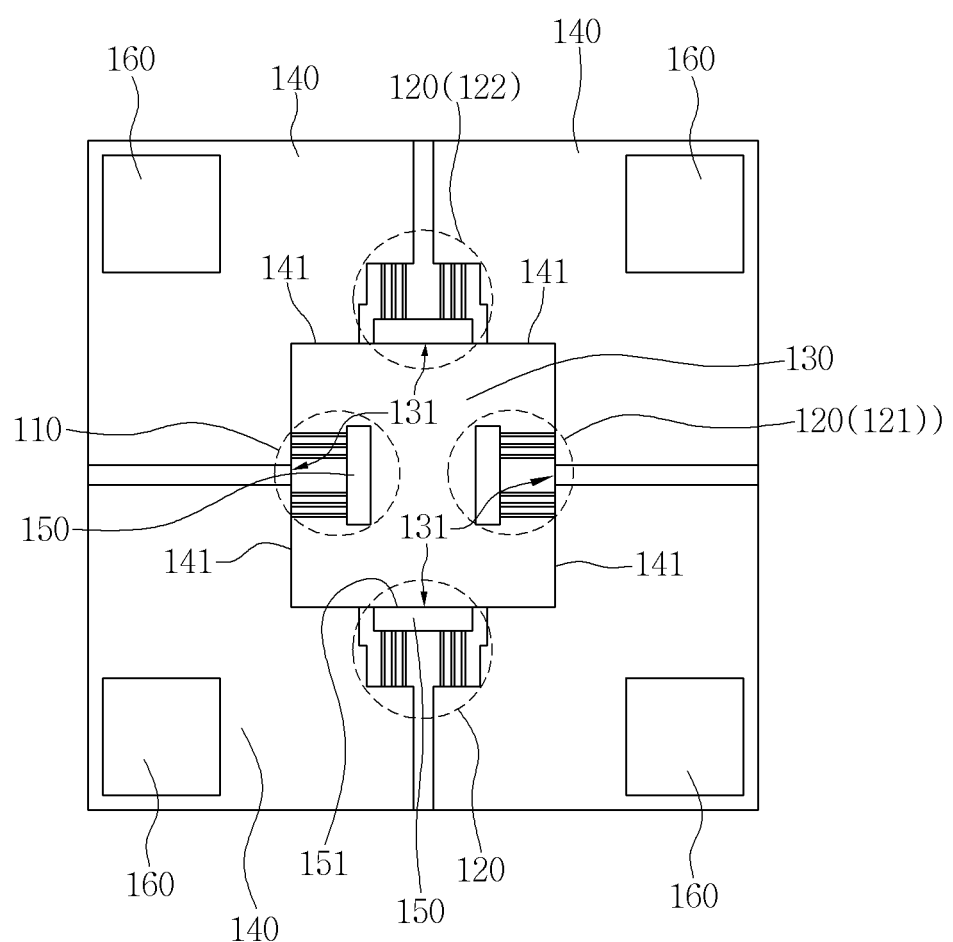
FIG. 2 is a top view of the silicon nanowire pressure sensor according to the embodiment of the present invention.
Figure 3:
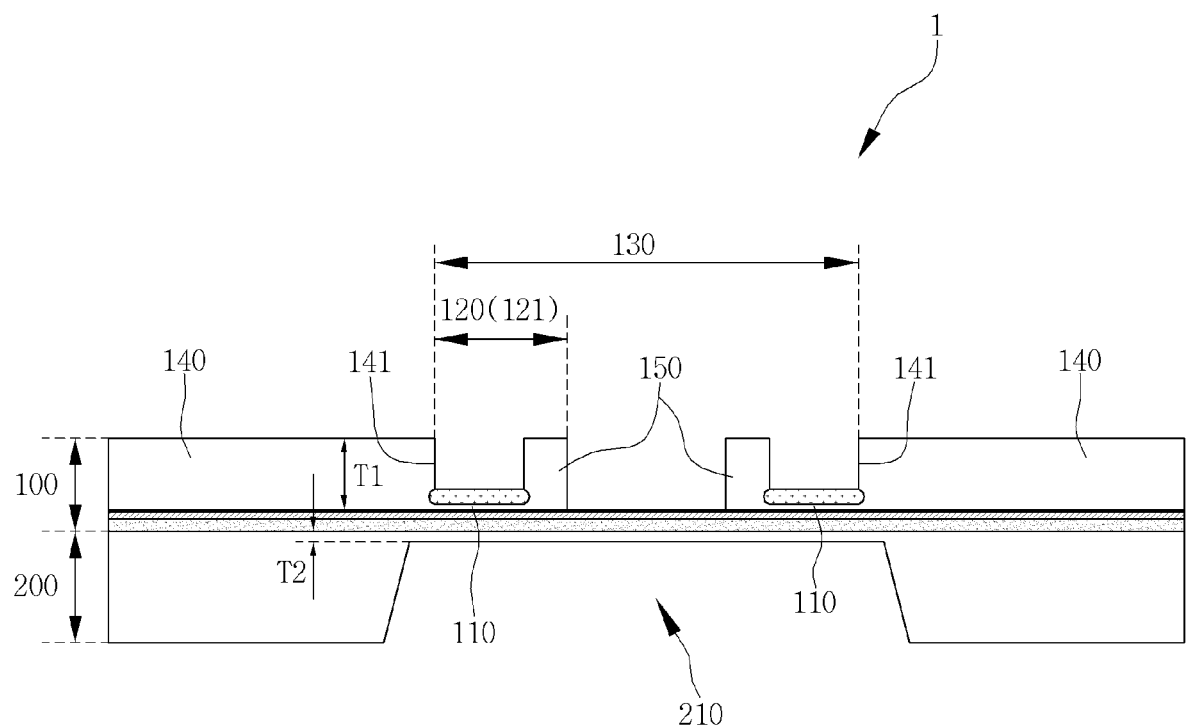
FIG. 3 is a cross-sectional view taken along a line A-A' of FIG. 1 to illustrate the silicon nanowire pressure sensor according to the embodiment of the present invention.

FIG. 1 is a perspective view illustrating a silicon nanowire pressure sensor 1 according to one embodiment of the present invention, FIG. 2 is a top view of the silicon nanowire pressure sensor 1 according to the embodiment of the present invention, and FIG. 3 is a cross-sectional view illustrating the silicon nanowire pressure sensor 1 according to the embodiment of the present invention.

According to one embodiment of the present invention, the silicon nanowire pressure sensor 1 includes a lower substrate 200 having a diaphragm recess 210 in a lower surface thereof, an upper substrate 100 having a first surface attached to an upper surface of the lower substrate 200, and a silicon nanowire 110 famed on the first substrate of the upper substrate 100. The silicon nanowire pressure sensor 1 further includes resistive portions 120 formed on a second surface of the upper substrate 100 so as to be exposed and a diaphragm region 130 that is formed by etching a center portion of the second surface of the upper substrate 100. The diaphragm recess 210 is formed to be larger than the diaphragm region 130.

The upper substrate 100 and the lower substrate 200 are silicon substrates. Referring to FIG. 3, the lower substrate 200 has the diaphragm recess 210 in the lower surface thereof. The diaphragm recess 210 is formed by etching the lower substrate 200 from the lower substrate until the lower substrate 200 has a very small thickness. That is, in the process of forming the diaphragm recess 210, the etching is performed to leave only a thin film at an upper portion of the lower substrate 200.

The first surface of the upper substrate 100 is attached to the upper surface of the lower substrate 200. The first surface of the upper substrate 100 is provided with silicon nanowires 110. Referring to FIG. 3, a center portion of a second surface of the upper substrate 100, i.e., a portion around the resistive portions 120, is etched away such that silicon blocks 140, which will be described in greater detail below, are formed and the diaphragm region 130 is defined. The resistive portion 120 includes the silicon nanowire 110, a wet silicon oxide film 170d formed through a wet oxidation process, and a sub silicon block 150. When the center portion of the second surface of the upper substrate 100 is etched, the wet silicon oxide film 170d of the resistive portion 120 is exposed on the second surface of the upper substrate 100.

When the diaphragm region 130 is formed, the silicon substrate is etched using the resistive portion 120 as an alignment mark and the silicon blocks 140 are formed. Therefore, the resistive portion 120 is formed at a position near a side wall 141 of the silicon block, the position where mechanical deformation of the diaphragm region 130, attributable to a force applied through the diaphragm recess 210 of the lower substrate 200, is greatest. That is, the resistive portion 120 is formed at a boundary of the diaphragm region 130. Referring to FIG. 3, the silicon blocks 140 on the upper substrate have a first thickness T1 that is enough to withstand the force applied through the diaphragm recess 210 so that the silicon blocks 140 will not be deformed by the force. Thus, the first thickness T1 needs to be larger than a second thickness that is the thickness of the lower substrate 200 in a region in which the diaphragm recess 210 is formed. With this structure, the mechanical deformation of the silicon nanowire 110 of the resistive portion 120 increases. For this reason, a change in resistance of the resistive portion 120 increases, and thus the sensitivity of the pressure sensor 1 increases.

The diaphragm recess 210 is formed to be larger than the diaphragm region 130. Since the diaphragm region 130 is designed such that the mechanical deformation is greatest at the boundary 131 of the diaphragm region 130 by positioning the walls of the silicon blocks at the boundary 131, a highly precise alignment between the diaphragm region 130 and the diaphragm recess 210 is not required. The only requirement for the diaphragm recess 210 is that it is formed to be larger than the diaphragm region 130 so that the force can be applied to the boundary 131 of the diaphragm region. For this, since a high alignment precision is not required, a defect rate can be dramatically reduced in manufacturing the pressure sensors 1.

Figure 6A:
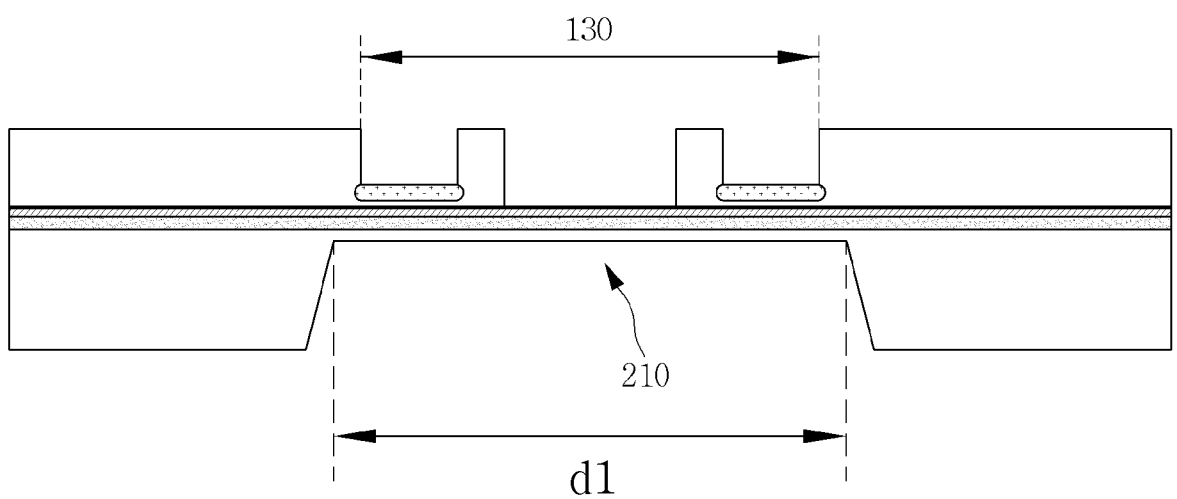
FIGS. 6A, 6B and 6C are cross-sectional views taken along the line A-A' of FIG. 1 to illustrate arrangement of a diaphragm region and a diaphragm recess in the silicon nanowire pressure sensor according to one embodiment of the present invention.
Figure 6B:
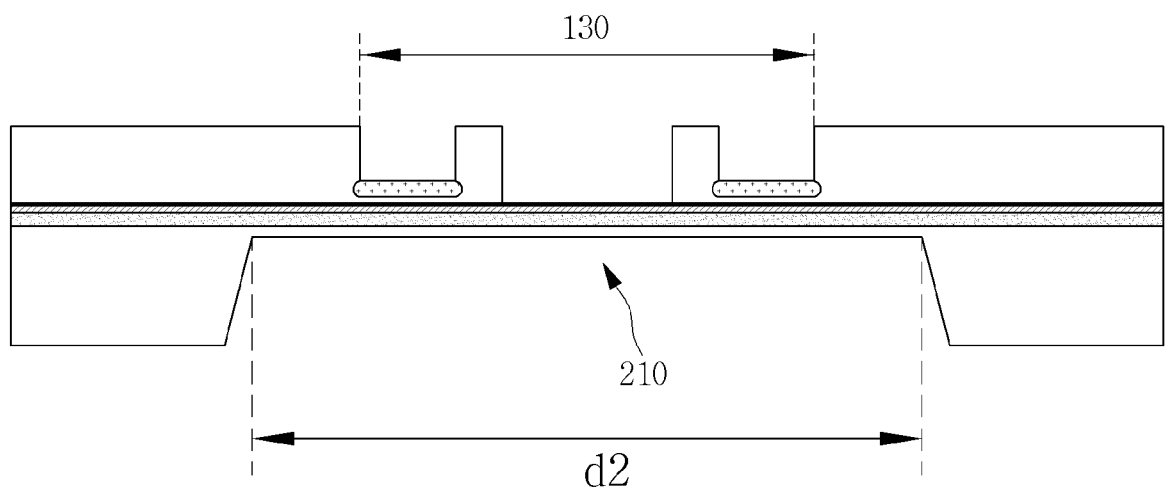
Figure 6C:
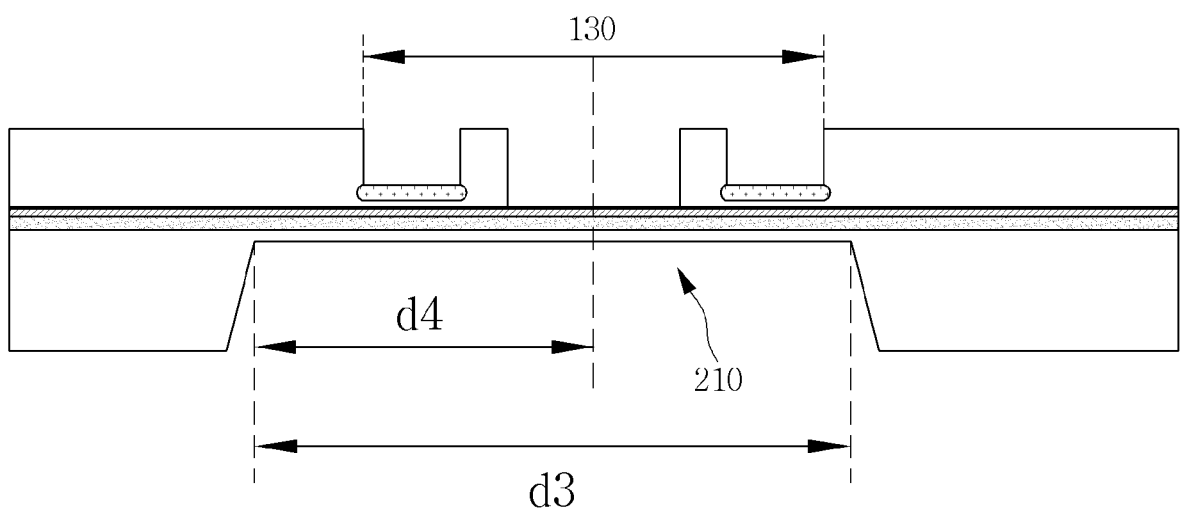

Referring to FIGS. 6A, 6B and 6C, although the diaphragm recess 210 varies in size, the functioning of the pressure sensor 1 is not negatively affected. The diaphragm recess 210 and the diaphragm region 130 may be well aligned and identical to each other as illustrated in FIG. 6A. Alternatively, the diaphragm recess 210 may be larger than the diaphragm region 130 as illustrated in FIG. 6B. Further alternatively, the center of the diaphragm recess 210 may not be aligned with the center of the diaphragm region 130 as long as the diaphragm recess 210 is larger than the diaphragm region 130 as illustrated in FIG. 6C. That is, in this case, the pressure sensor 1 does not malfunction. That is, the diaphragm region 130 is formed to be within inside the diaphragm recess 210 when seeing the pressure sensor 1 from below.

In the silicon nanowire pressure sensor 1 according to one embodiment of the present invention, the second surface of the upper substrate 100 is locally etched such that a plurality of silicon blocks 140 is formed to be electrically insulated from each other on the second surface of the upper substrate 100. The silicon blocks 140 are electrically connected only via the resistive portions 120. In addition, a part of side walls 141 of the silicon blocks are aligned with the boundaries 131 of the diaphragm region 130.

The silicon blocks 140 are formed by locally etching the second surface of the upper substrate 100. The second surface of the upper substrate 100 is etched to form trenches each of which spaces the adjacent silicon blocks 140. At the time of forming the trenches, since a silicon oxide film is also etched, the silicon blocks 140 are electrically insulated from each other. The silicon blocks 140 can be electrically connected only via the resistive portions 120. In the resistive portion 120, the silicon nanowire 110 is formed to bridge the silicon block 140 and the sub silicon block 150. The adjacent silicon blocks 140 are electrically connected to each other via the resistive portion 120 that is a series connection of one silicon nanowire 110, one sub silicon block 150, and another silicon nanowire 110.

Here, at least part of the silicon block 141 is aligned with the boundary 131 of the diaphragm region. Therefore, the side walls 141 of the silicon blocks define the diaphragm region 130. Thus, only the resistive portion in the diaphragm region 130 is mechanically deformed by the force applied through the diaphragm recess 210.

Figure 4:
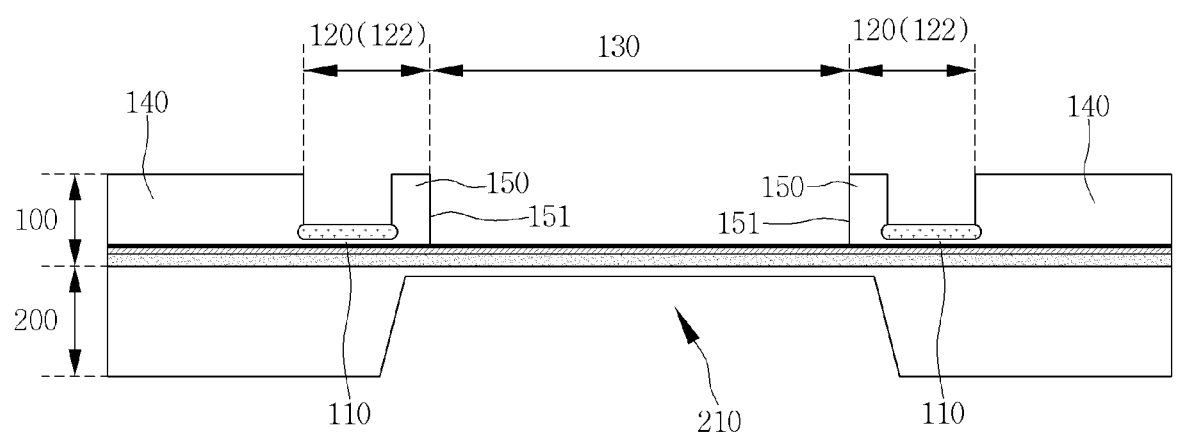
FIG. 4 is a cross-sectional view taken along a line B-B' of FIG. 1 to illustrate the silicon nanowire pressure sensor according to the embodiment of the present invention.

FIGS. 3 and 4 are cross-sectional views illustrating the silicon nanowire pressure sensor 1 according to one embodiment of the present invention.

In the silicon nanowire pressure sensor 1 according to one embodiment of the present invention, the resistive portions 120 consist of first resistive portions 121 provided inside the diaphragm region 130 and second resistive portions 122 provided outside the diaphragm region 130.

The resistive portions 120 consist of the first resistive portions 121 serving as variable resistors and the second resistive portions 122 serving as fixed resistors.

Referring to FIG. 3, the first resistive portion 121 is disposed inside the diaphragm region 130 so that the silicon nanowire 110 of the first resistive portion 121 receives mechanical stress. As described, since the diaphragm region 130 is formed to be near the resistive portions 120, the first resistive portion 121 can be formed inside the diaphragm region 130 so as to be near the boundary 131 of the diaphragm region at which the mechanical deformation is greatest over the entire area of the diaphragm region 130. Therefore, the resistance of the silicon nanowire 110 of the first resistive portion 121 easily varies according to mechanical deformation thereof. That is, the first resistive portions 121 serve as variable resistors.

The sub silicon blocks 150 of the first resistive portions 121 are provided inside the diaphragm region 130. The sub silicon block 150 of the first resistive portion 121 is spaced from a corresponding one of the silicon blocks 140, with the silicon nanowire 110 provided there between. Therefore, when force is applied to the pressure sensor through the diaphragm recess 210 and accordingly the resistive portion in the diaphragm region 130 moves, since there is no constraining part that limits the movement of the sub silicon block 150, the sub silicon block 150 also moves.

Referring to FIG. 4, the second resistive portion 122 is disposed outside the diaphragm region 130 so that the silicon nanowire 110 of the second resistive portion 122 does not receive mechanical stress. Therefore, the silicon nanowire 110 of the second resistive portion 122 serves as a fixed resistor.

The sub silicon blocks 150 of the second resistive portions 122 are provided outside the diaphragm region 130. Referring to FIG. 2, the sub silicon blocks 150 of the second resistive portions 122 are spaced from the silicon blocks with trenches disposed there between. In addition, a part of side walls 151 of the sub silicon blocks of the second resistive portions 122 are disposed at the boundaries 131 of the diaphragm region. Therefore, unlike the sub silicon blocks 150 of the first resistive portions, since each of the sub silicon blocks 150 of the second resistive portions 122 is interposed between two silicon blocks 140 and the silicon blocks are not moved by the force applied through the diaphragm recess 210, the sub silicon blocks 150 of the second resistive portions 122 disposed in the vicinity of the silicon bocks 140 also do not move. Since no movement occurs in the second resistive portions 122 and accordingly the silicon nanowires 110 of the second resistive portions 122 are mechanically deformed, the resistance of the second resistive portions 122 does not change. That is, the second resistive portions 122 serve as fixed resistors.

Since the sub silicon blocks 150 of the second resistive portion 122 are not moved by an external pressure, the side walls 151 of the sub silicon blocks of the second resistive portions 122 can define the boundary of the diaphragm region by being disposed at the boundary in conjunction with the silicon blocks 140 by being disposed at the boundary 131 of the diaphragm region.

Figure 5A:
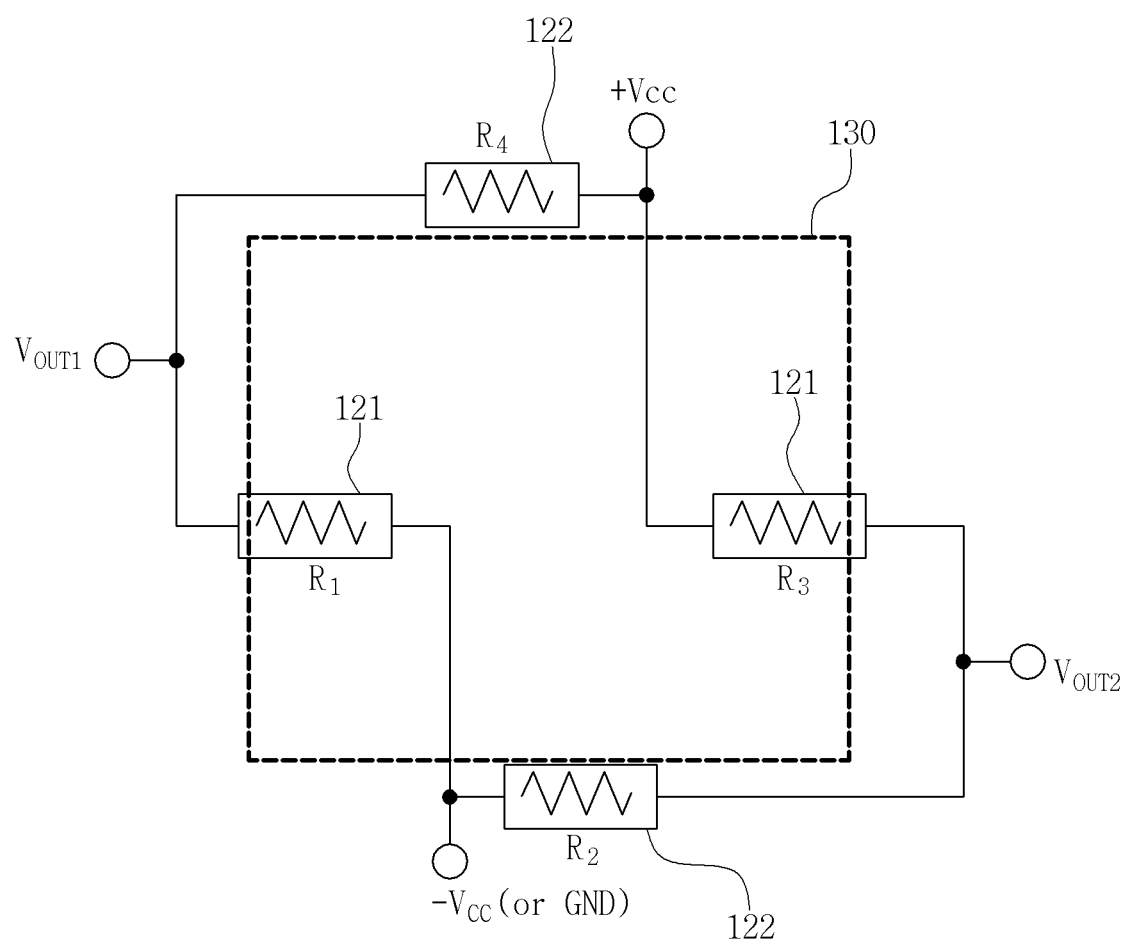
FIGS. 5A and 5B are circuit diagrams illustrating arrangement of resistive portions of the silicon nanowire pressure sensor according to the embodiment of the present invention.
Figure 5B:
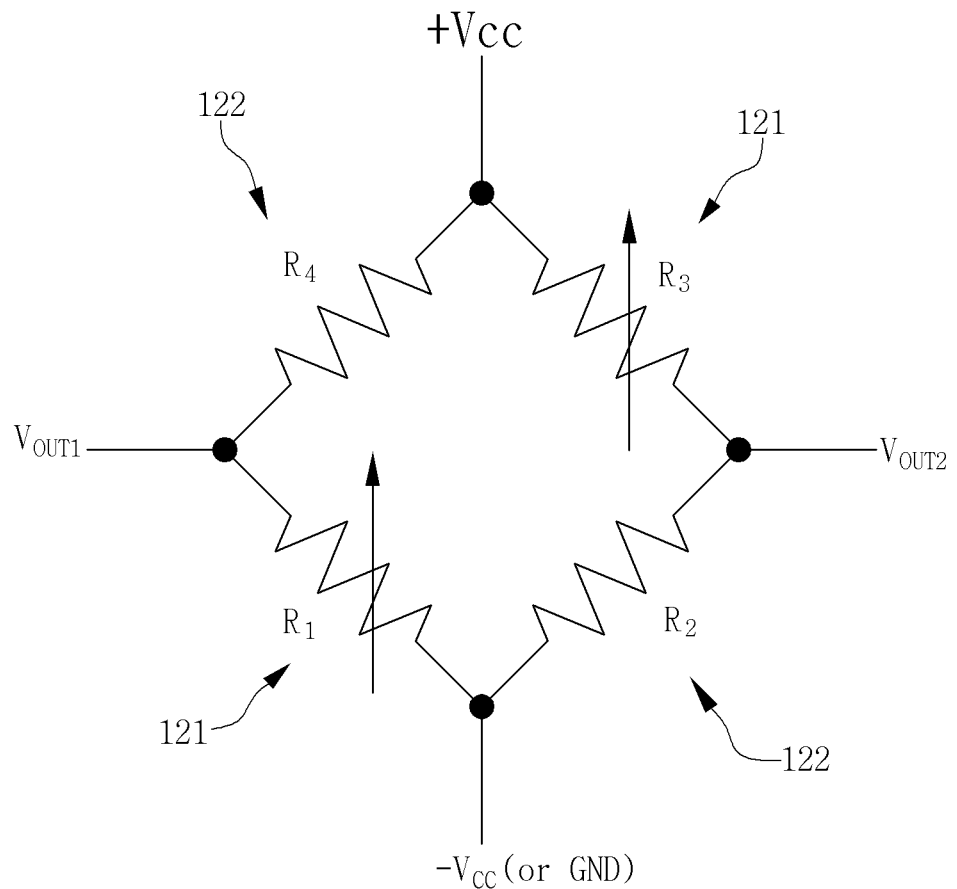

FIGS. 5A and 5B are circuit diagrams of the silicon nanowire pressure sensor 1 with four resistive portions 120, according to one embodiment of the present invention.

In the silicon nanowire pressure sensor 1 according to one embodiment of the present invention, the number of the silicon blocks 140 is four and the four silicon blocks 140 are positioned in four quadrants of the upper substrate 100 respectively. The number of the first resistive portions 121 is two. The two first resistive portions 121 are positioned at opposite sides of a middle portion of the upper substrate 100 in a first direction so as to be separated from each other. Each of the first resistive portions 122 electrically connects two silicon blocks adjacent thereto among the four silicon blocks. The number of the second resistive portions 122 is also two. The two second resistive portions 122 are disposed to be separated from each other in a second direction perpendicular to the first direction in which the first resistive portions 121 are arranged. Each of the second resistive portions 122 electrically connects two silicon blocks 140 adjacent thereto among the four silicon blocks 140.

As illustrated in FIGS. 5A and 5B, the pressure sensor 1 according to one embodiment of the present invention includes four resistive portions 120. The four resistive portions 120 form a Wheatstone bridge circuit. The circuit includes two first resistive portions 121 and two second resistive portions 122. As illustrated in FIG. 5A, the first resistive portions 121 are disposed inside the diaphragm region 130 and the second resistive portions 122 are disposed outside the diaphragm region 130. As illustrated in FIG. 5B, the first resistive portions 121 serve as variable resistors and the second resistive portions 122 serve as fixed resistors.

The four resistive portions 120 are set to have an equal resistance initially. Referring to FIG. 2, as to the resistive portions 120 each connecting two adjacent silicon blocks 140, the silicon nanowires 110 of the respective resistive portions 120 are identical, and the sub silicon blocks 150 of the respective resistive portions 120 are equal in thickness, width, and length. Since all of the resistive portions 120 are configured have an equal resistance, and two of the four resistive portions 120 vary in resistance, a controller can effectively detect a change in pressure.

The silicon blocks 140 serve as signal lines (conducting wires) of the Wheatstone bridge circuit. The electrical resistances of objects made of the same material are in proportion to the length of the objects and are in inverse proportion to the cross-sectional area of the objects. In the embodiment, the silicon nanowires 110 are formed to have a small cross-sectional area and a relatively long length compared to the cross-sectional area. Meanwhile, the silicon bocks 140 are formed to have a relatively large cross-sectional area compared to the length thereof. Accordingly, the silicon nanowires 110 have a considerably larger resistance than the silicon blocks 140. Therefore, the silicon blocks 140 having a much smaller resistance serve as the conducting wires in FIG. 5A.

The silicon blocks 140 are disposed in the respective quadrants of the upper substrate 100. Therefore, four silicon blocks 140 are required. The quadrants are divided by trenches. When forming the trenches by etching the upper substrate 100, the silicon oxide film 170 formed on the upper substrate 100 is also etched so that the silicon blocks 140 are electrically insulated.

Two silicon nanowires 110 serving as the first resistive portions 121 are positioned at the boundaries of the quadrants at respective sides of a middle portion of the upper substrate 100. Therefore, each of the first resistive portions 121 electrically connect two silicon blocks 140 adjacent thereto, in which the two silicon blocks 140 electrically connected by one first resistive portion 121 are different ones electrically connected by another first resistive portion 121. That is, there is no case that the same silicon block 140 is electrically connected by both of the two first resistive portions 121. Referring to FIG. 5B, the first resistive portions 121 extend in a diagonal direction. The second resistive portions 122 are disposed at the boundaries of the quadrants and spaced from each other in a direction perpendicular to the direction in which the first resistive portions 121 are spaced from each other. Like the first resistive portions 121, each of the second resistive portions 121 electrically connect two silicon blocks 140 adjacent thereto such that the same silicon block 140 is not electrically connected by both of the two first resistive portions 121.

The silicon nanowire pressure sensor 1 according to one embodiment of the present invention further includes electrodes 160 formed on the silicon blocks 140, respectively.

Referring to FIG. 1, each of the silicon block 140 is provided with one electrode 160, and the electrodes 160 serve as a Vcc electrode, a GND electrode, a Vout1 electrode, and a Vout2 electrode, respectively. The electrodes 160 may be formed at corners of the second surface of the upper substrate 100. The electrodes 160 may be formed of a metal such as aluminum.

A method of manufacturing a silicon nanowire pressure sensor 1 according to one embodiment of the present invention will be described below. The method includes a first step of preparing an upper substrate 100 on which resistive portions 120 including respective silicon nanowires 110 are formed, a second step of preparing a lower substrate 200, a third step of attaching a first surface of the upper substrate 100 to an upper surface of the lower substrate 200, a fourth step of etching a center portion of a second surface of the upper substrate 100, using the resistive portions 120 as alignment reference positions for the etching, to form a diaphragm region 130 at the center portion, and a fifth step of etching a lower surface of the lower substrate 200 to form a diaphragm recess 210 that is larger than the diaphragm region 130.

Figure 7A:
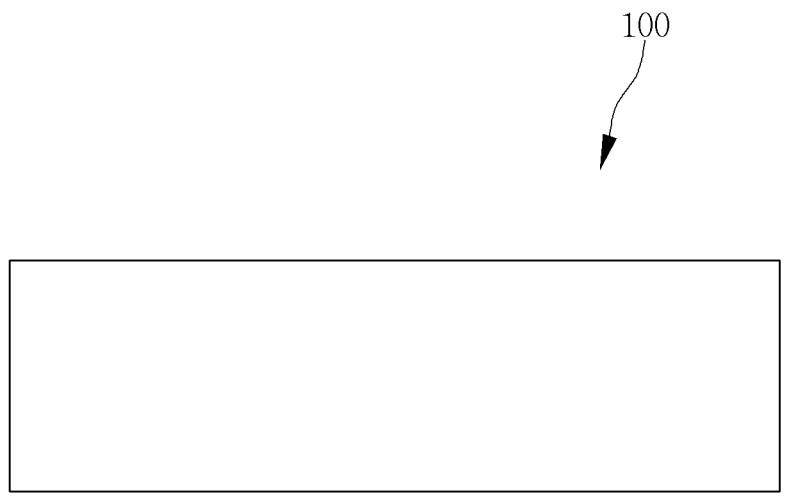
FIGS. 7A, 7B, 7C, 7D, 7E and 7F are enlarged cross-sectional views taken along a line C-C' of FIG. 1 to illustrate process steps of manufacturing a silicon nanowire formed on an upper substrate in a method of manufacturing a silicon nanowire pressure sensor according to one embodiment of the present invention.
Figure 7B:
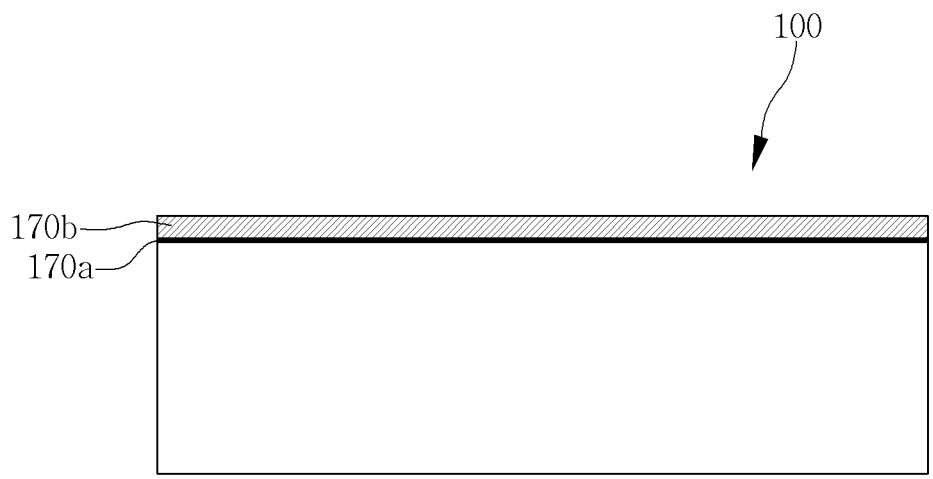
Figure 7C:
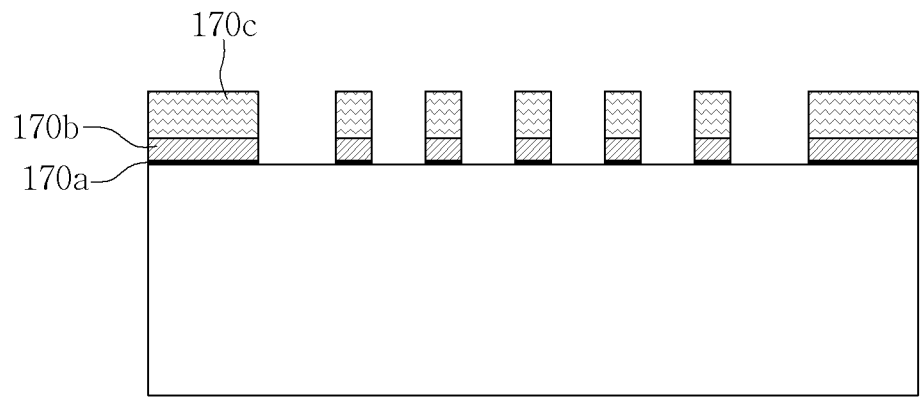
Figure 7D:
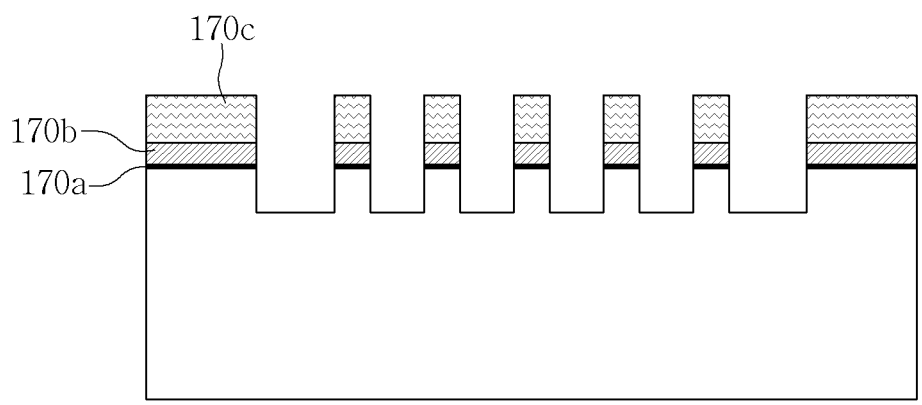
Figure 7E:
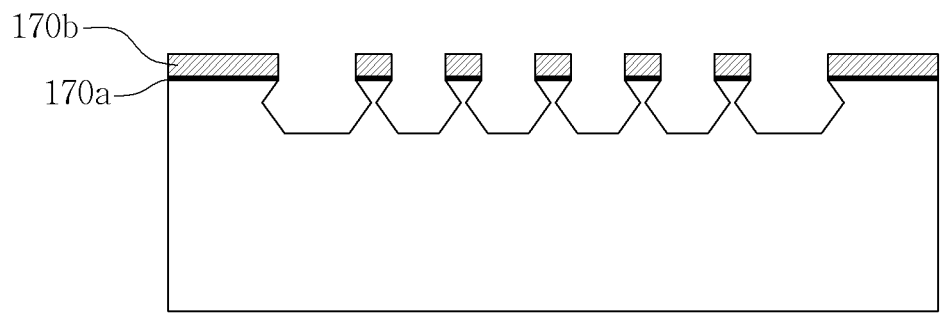
Figure 7F:
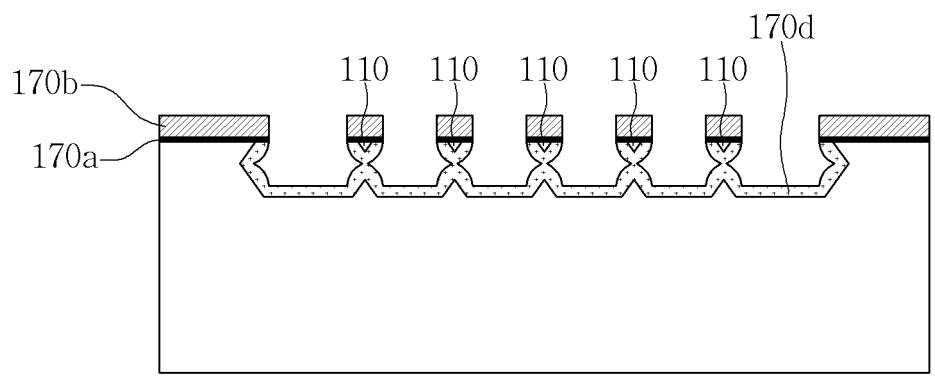
Figure 7G:
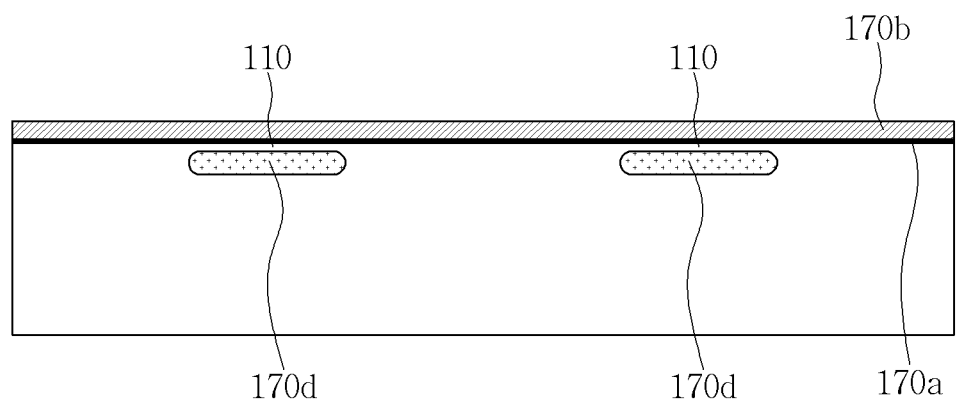
FIG. 7G is an enlarged cross-sectional view taken along the line A-A' of FIG. 1 to illustrate the silicon nanowire famed on the upper substrate in the method of manufacturing the silicon nanowire pressure sensor according to the embodiment of the present invention.

In the first step, prepared is the upper substrate 100 on which the resistive portions 120 including the respective silicon nanowires 110 are formed. The first step will be described in detail below. First, as illustrated in FIG. 7A, a silicon substrate is prepared as the upper substrate 100. Next, as illustrated in FIG. 7B, a silicon oxide film 170a and a silicon nitride film 170b are sequentially formed on the upper substrate 100. Next, as illustrated in FIG. 7C, a photoresist layer 170c is formed on the resulting structure on the upper substrate 100. Next, photolithography is performed on the photoresist layer 170c to form a predetermined pattern of the photoresist layer on the upper substrate 100, thereby locally exposing the silicon nitride film 170b. Next, dry etching is performed to locally and sequentially remove the silicon nitride film 170b and the silicon oxide film 170a, thereby obtaining the upper substrate 100 that is locally exposed. Next, dry etching is performed again to etch the exposed portions of the upper substrate 100 to a predetermined etching depth, thereby forming a plurality of recessed portions in the upper substrate 100 as illustrated in FIG. 7D. Next, the pattern of the photoresist layer 170c is removed. Next, anisotropic etching is performed on the upper substrate 100 using a potassium hydroxide (KOH) solution or a tetramethylammonium hydroxide pentahydrate (TMAH) solution, so that the upper substrate 100 is anisotropically etched within the recessed portions. As a result, each recessed portion has a wall profile that is tapered to an upper end and a lower end thereof from a mid-depth portion of the recessed portion. That is, the width of the recessed portion is largest at the mid-depth portion and gradually decreases toward the upper end or the lower end. As a result, nanowire structures are formed between the recessed portions as illustrated in FIG. 7E. Next, wet oxidation is performed to form a wet silicon oxide film 170d on the upper substrate 100, thereby electrically insulating an upper end portion and a lower end portion of each nanowire structure from each other. The resulting silicon nanowires 110 are illustrated in FIGS. 7F and 7G.

Figure 8A:
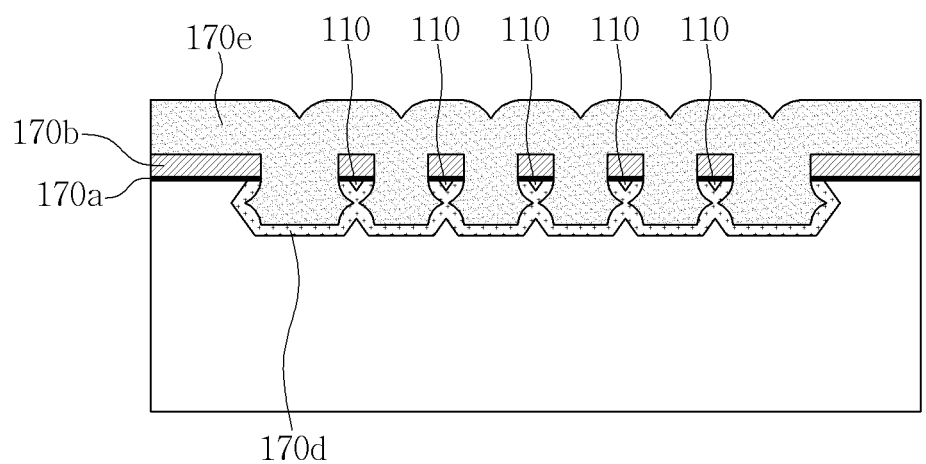
FIGS. 8A, 8B and 8C are cross-sectional views taken along the line C-C' of FIG. 1 to illustrate a step of forming an insulating layer on the upper substrate in the method of manufacturing the silicon nanowire pressure sensor according to the embodiment of the present invention.
Figure 8B:
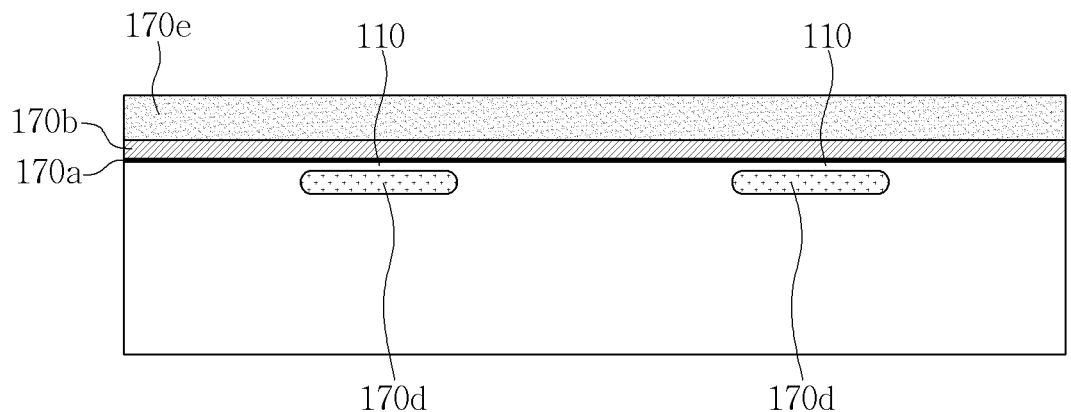
Figure 8C:
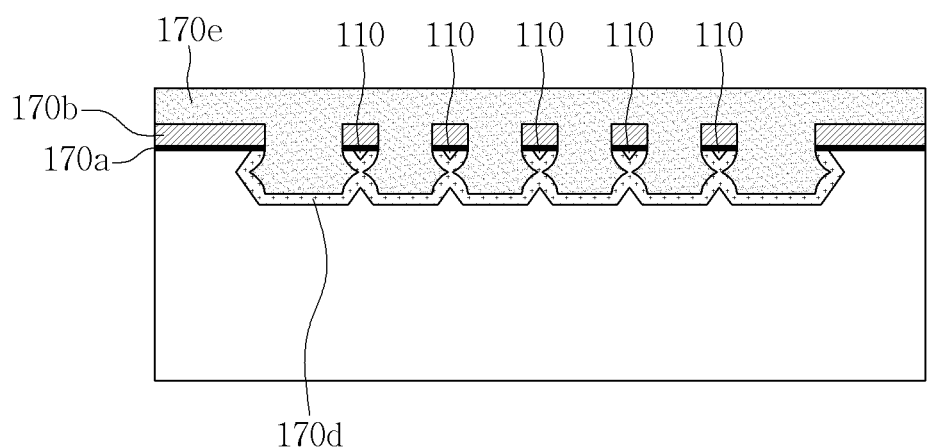
Figure 8D:
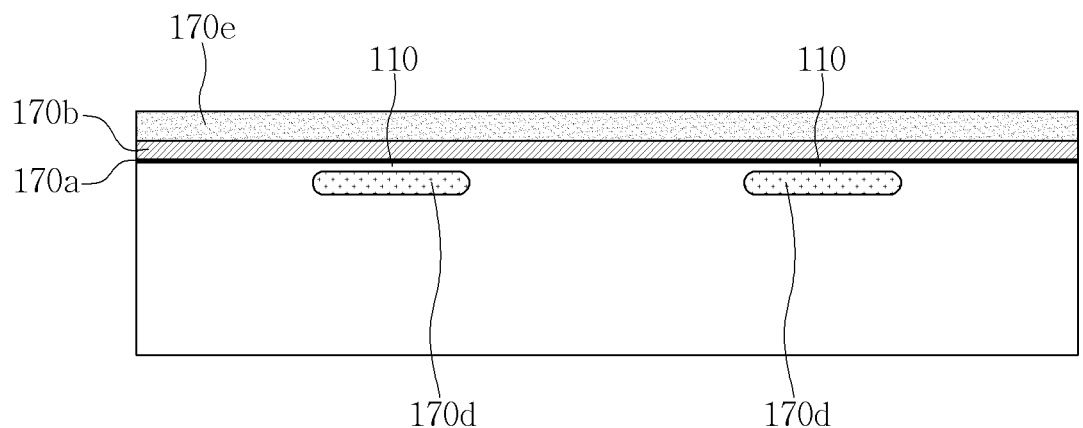

An insulating layer 170e is deposited on the second surface of the upper substrate 100 after the silicon nanowires are formed. The insulating layer 170e may be formed of tetraethyl orthosilicate (TEOS). As illustrated in FIGS. 8A and 8B, the insulating layer 170e is formed to fill the recessed portions that are formed on the upper substrate 10 at the step of forming the silicon nanowires 110. Next, the insulating layer 170e undergoes surface polishing so that the insulating layer 170e is partially removed, leaving a flat and smooth surface (planarized surface) on the upper substrate 100. Since the remaining insulating layer 170e determines the thickness of the diaphragm region 130, the surface polishing needs to be precisely controlled such that the remaining insulating layer 170e has a predetermined thickness.

The second step is a step of preparing the lower substrate 200. The lower substrate 200 is a silicon substrate.

Figure 9A:
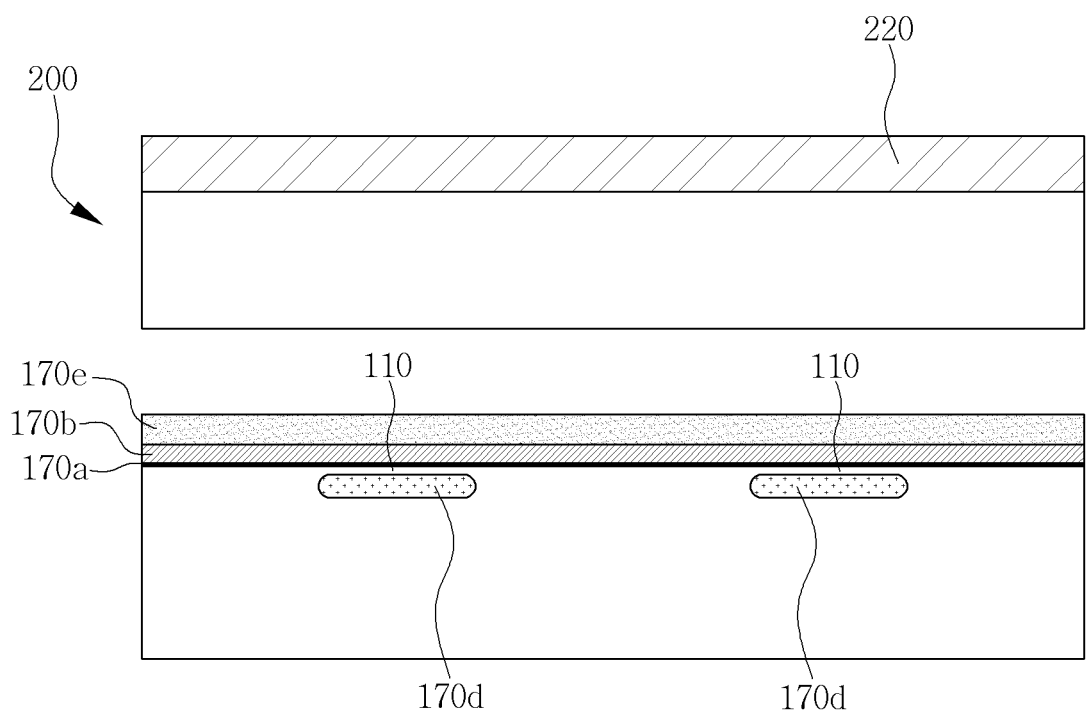
FIGS. 9A, 9B, 9C and 9D are cross-sectional views taken along the line A-A' of FIG. 1 to illustrate steps of forming a pressure sensor in the method of manufacturing the silicon nanowire pressure sensor according to the embodiment of the present invention.
Figure 9B:
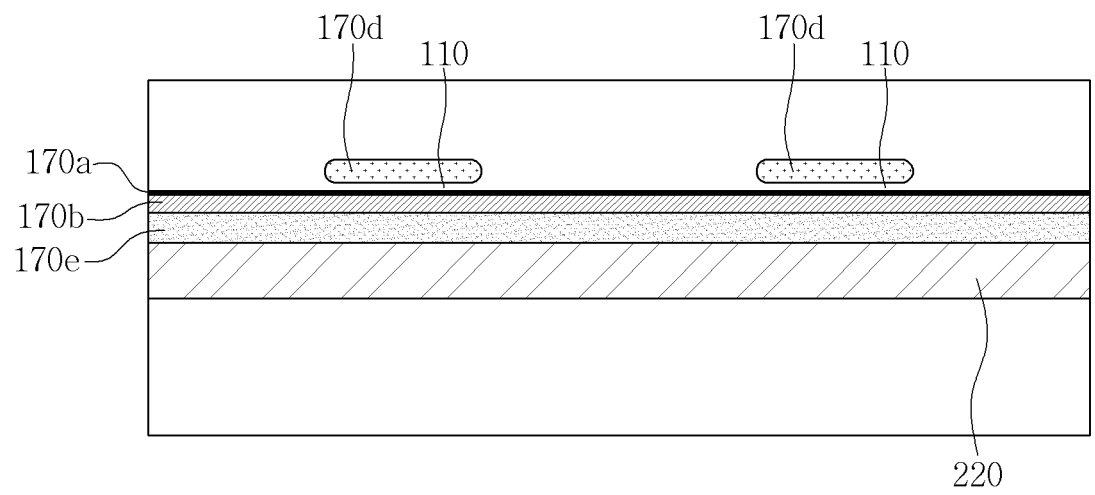

The third step is a step of attaching the upper substrate 100 to an upper surface of the lower substrate 200 (see FIGS. 9A and 9B). The attachment may be performed through fusion bonding. Alternatively, glass frit bonding, eutectic bonding, or epoxy bonding may be used in which a suitable bonding material may be applied to the contact surfaces of the upper and lower substrates.

The fourth step is a step of forming a diaphragm region 130 by etching a center portion of a second surface of the upper substrate 100, using the resistive portions 120 as alignment reference positions for the etching.

The fourth step includes a thinning step of thinning the upper substrate 100 by a first thickness from the second surface so that the remaining upper substrate 100 has a predetermined thickness, an electrode forming step of forming electrodes 160 on the second surface of the upper substrate 100, and an insulation step of etching a center portion of the second surface of the upper substrate 100, using the resistive portions 120 on the second surface of the upper substrate 100 as alignment reference positions for the etching, to expose the resistive portions 120, in which a part of side walls of a plurality of silicon blocks are disposed at boundaries 131 of the diaphragm region 130, and the silicon blocks 140 are electrically connected only via the resistive portions 120.

Figure 9C:
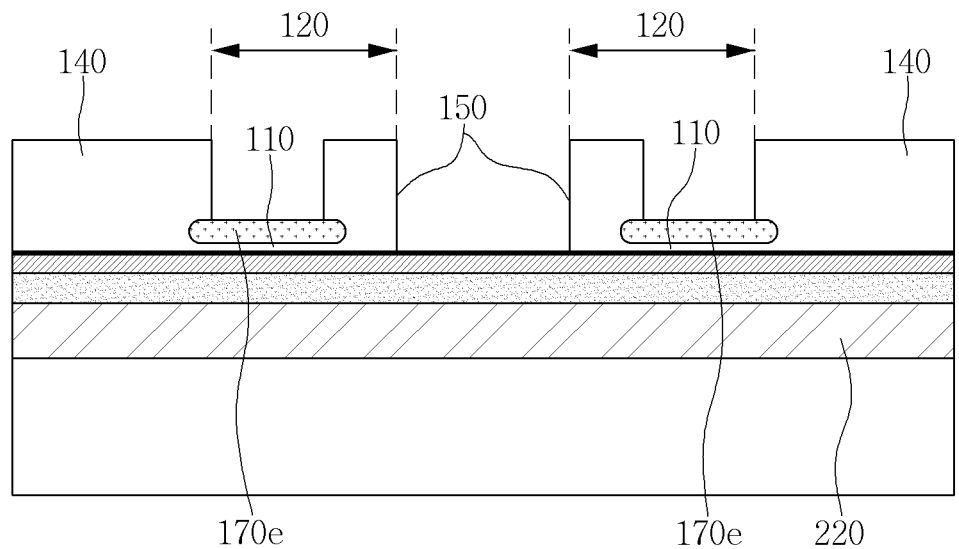

In the fourth step, the upper substrate 100 is removed by a first thickness from the second surface. The removal is performed using a surface polishing method. Through this removal process, the upper substrate 100 is thinned to a predetermined thickness (see FIGS. 9A and 9B). Next, electrodes 160 are formed on the second surface of the upper substrate 100. The electrodes 160 are formed by depositing a metal such as aluminum and by patterning the metal. Besides the deposition and patterning of the metal, for ohmic contact of the electrodes 160, the electrode formation step includes high-dose ion implantation, silicide formation, and thermal treatment that are performed with respect to the regions at which the electrodes 160 are to be formed. The resulting structure through the insulation step is described above. The insulation step produces the upper substrate 100 divided into four silicon blocks 140, in which the silicon blocks 140 are electrically connected only via the silicon nanowires 110 (see FIG. 9C).

The fifth step is to form a diaphragm recess 210 that is larger than the diaphragm region 130. The diaphragm recess 210 is formed by etching the lower surface of the lower substrate 200. The reason why the diaphragm recess 210 is foamed to be larger than the diaphragm region 130 will be described below.

In the method of manufacturing the silicon nanowire pressure sensor 1 according to the embodiment of the present invention, the second step is to prepare the lower substrate 200 with doped regions 220 formed in a second surface (upper surface), and the fifth step is to form the diaphragm recess 210 by etching a first surface (lower surface) of the lower substrate 200 up to a position near the doped region 220. This etching is performed until a condition in which an etching rate is significantly reduced is met. Thus, the diaphragm recess 210 is formed by locally thinning a middle portion of the lower substrate 200 so that the middle portion of the lower substrate 200 has a uniform thickness.

Figure 9D:
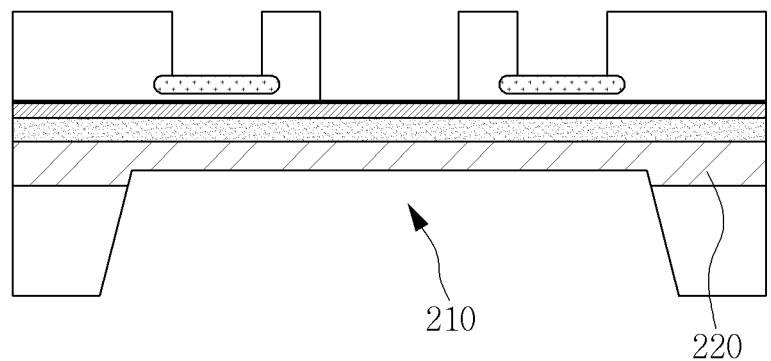

The second step is to prepare the lower substrate 200 in which the doped regions 220 are formed under the second surface. Regarding the second step, it is necessary to precisely control the thickness of the diaphragm region 130. Therefore, it is important that the lower substrate 200 is foiled to have a uniform and accurate thickness in a region at which the diaphragm recess 210 is formed. To this end, p-type impurity ions such as boron ions are implanted at a high dose into the lower substrate 200. The ion implantation is performed such that the doped region 220 is foamed at a predetermined depth from the second surface of the lower substrate 200 (see FIG. 9A). For this reason, when silicon wet etching is performed to form the diaphragm recess 210 in the lower substrate 100, an etching rate is distinctly reduced when the etching depth reaches the doped region 220. Accordingly, when the lower surface of the lower substrate 200 is etched to form the diaphragm recess 210, the etching is stopped when a predetermined condition is met in which the etching rate is considerably reduced. Thus, the diaphragm recess 210 is formed such that the thickness of the remaining portion of the lower substrate 200 is uniform (see FIG. 9D).

Regarding the manufacturing method of the silicon nanowire pressure sensor 1 according to one embodiment of the present invention, in the first step, the resistive portions 120 include first resistive portions 121 and second resistive portions 122. At the insulation step, the second surface of the upper substrate 100 is etched such that the first resistive portions 121 are formed within the diaphragm region 130 and the second resistive portions 122 are formed outside the diaphragm region 130.

The resistive portions 120 include the first resistive portions 121 and the second resistive portions 122. Since the positional relationship of the resistive portions 120 and the silicon blocks 140 and the positions of the resistive portions 120 on the upper substrate 100 are described above, a description thereof will not be duplicated here.

The first resistive portions 121 serve as variable resistors and the second resistive portions 122 serve as fixed resistors. Since the positional relationship of the first resistive portions 121 and the second resistive portions 122 with the diaphragm region 130 is described above, a description thereof will not be duplicated here.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A silicon nanowire pressure sensor comprising:
   a lower substrate having a diaphragm recess in a lower surface thereof;
   an upper substrate having a first surface attached to an upper surface of the lower substrate;
   a resistive portion including a silicon nanowire formed on a first surface of the upper substrate and exposed on a second surface of the upper substrate; and
   a diaphragm region formed by etching a center portion of the second surface of the upper substrate with alignment reference of the resistive portions,
   wherein the diaphragm recess is larger than the diaphragm region,
   wherein a plurality of silicon blocks is formed on the second surface of the upper substrate to be spaced from each other by locally etching the second surface of the upper substrate and electrically connected only via the resistive portion, and
   wherein side walls of a part of the silicon blocks constitute a boundary of the diaphragm region.

2. The silicon nanowire pressure sensor according to claim 1, wherein the resistive portion includes first resistive portions formed inside the diaphragm region and second resistive portions formed outside the diaphragm region.

3. The silicon nanowire pressure sensor according to claim 2, wherein the number of silicon blocks is four and the four silicon blocks are positioned in four quadrants of the upper substrate respectively,
   the number of the first resistive portions is two and the two first resistive portions are disposed at boundaries of the quadrants so as to be spaced from each other with respect to the center of the upper substrate, and the two first resistive portions electrically connect two adjacent silicon blocks to each other among the four silicon blocks,
   the number of second resistive portions is two and the two second resistive portions are disposed at boundaries of the quadrants so as to be spaced from each other with respect to the center of the upper substrate in a direction perpendicular to the direction in which the first resistive portions are spaced, and the two second resistive portions electrically connect two adjacent silicon blocks to each other among the four silicon blocks.

4. The silicon nanowire pressure sensor according to claim 3, further comprising electrodes formed on the respective silicon blocks.

* * * * *